United States Patent [19]

Palladino

[11] Patent Number: 5,073,456

[45] Date of Patent: Dec. 17, 1991

[54] MULTILAYER PRINTED CIRCUIT BOARD FORMATION

[75] Inventor: John V. Palladino, Paulsboro, N.J.

[73] Assignee: E. I. Du Pont de Nemours and Company, Wilmington, Del.

[21] Appl. No.: 446,335

[22] Filed: Dec. 5, 1989

[51] Int. Cl.$^5$ ................................................. B32B 9/00
[52] U.S. Cl. .................................... 428/446; 428/901; 524/188
[58] Field of Search ................. 428/446, 901; 524/188

[56] References Cited

U.S. PATENT DOCUMENTS

| | | | |
|---|---|---|---|
| 3,348,990 | 10/1967 | Zimmerman et al. | 156/293 |
| 3,644,166 | 2/1972 | Gause | 161/89 |
| 3,984,598 | 10/1976 | Sarazin et al. | 428/336 |
| 4,482,476 | 11/1984 | Yoshimura et al. | 524/262 |
| 4,499,152 | 2/1985 | Green et al. | 428/336 |
| 4,689,085 | 8/1987 | Plueddemann | 528/33 |

FOREIGN PATENT DOCUMENTS 0310010 4/1989 European Pat. Off. .

*Primary Examiner*—Patrick J. Ryan
*Assistant Examiner*—Elizabeth Evans

[57] ABSTRACT

Multilayer printed circuit boards having a number of through-holes are formed employing intermediate layers in bonding copper circuitry to an insulating layer.

21 Claims, No Drawings

MULTILAYER PRINTED CIRCUIT BOARD FORMATION

BACKGROUND OF THE INVENTION

The present invention is directed to formation of multilayer printed circuit boards and articles formed thereby.

Multilayer PCB's are typically constructed by interleafing imaged conductive layers such as one containing copper with dielectric layers such as a partially cured B-stage resin, i.e., a prepreg, into a multilayer sandwich which is then bonded together by applying heat and pressure. Since a conductive layer with a smooth copper surface does not bond well to the prepreg, rough copper surfaces have been employed to obtain a better bond to a dielectric. Therefore, a portion of the multilayer PCB industry applies a mechanical roughening process step to assure better bonding. However, as circuit patterns get finer, there is an increasing risk of physically damaging the conductor traces during this surface preparation.

Another process employed by the industry to improve bonding between the conductive layer and the dielectric are various copper surface oxidation procedures widely practiced in the plating industry to assure good interphasial adhesion.

A common drawback for all processes relying mainly on the mechanical interlocking of a rough copper surface with the dielectric is the marginal bond strength with polyimide prepreg and the fact that there is no flexible bonding interphase to absorb the stresses originating from the different thermal expansion coefficients of copper and dielectric which can cause thermal shock failures.

Other technologies to improve bonding of conductive layers to dielectric layers in multilayer boards are described in U.S. Pat. No. 3,536,546, as well as European Patent Application 216,531 and also to U.S. Pat. No. 4,657,632, and involve the deposition of tin on the conductive layer prior to bonding. Whereas these techniques give improved bond strength compared to a copper surface, yield a surface less susceptible to mechanical damage than copper oxide, and require only ambient temperature processing in a less corrosive environment than copper oxide treatments, the resulting bond strengths are considered to be comparable to copper oxide on epoxy prepreg, and inferior to brown oxide on polyimide prepreg. Also the bond strength can deteriorate with time at elevated temperatures, as does the oxide bond. In addition, delamination after solder shock is occasionally observed.

An example of disclosure of a black oxide layer on a copper clad laminate as a step in the process of preparing multilayer circuit boards is disclosed in U.S. Pat. No. 4,512,818. The major drawbacks of these procedures are considered to be marginal bond strength on polyimide prepregs, corrosivity and high temperature processing, a surface coating prone to mechanical damage, partial delamination around through-holes called "pink ring" due to the removal of the bonding oxide layer by aggressive (acidic, reductive) hole cleaning chemicals, and a decay of the bond strength with time at elevated temperatures.

The formation of conductive layer topographies particularly suitable to improved bonding with prepreg without the drawbacks of the oxide treatments have been recently described at the Printed Circuit World Conference IV, Tokyo, Japan, June 2-5, 1987. H. Akahoshi et al. (WCIV-9) describe the formation of a surface oxide which gets removed prior to bonding, leaving a copper surface with roughness and bonding characteristics comparable to the oxide surface. Nakaso et al. (WCIV-10) describe the formation of a rough conductive layer surface by forming an electroless copper deposit on the conductive layer for better bonding. Silanes, deposited on this clean metallic copper surface are reported to yield a marginal increase in bond strength.

Likewise, U.S. Pat. No. 3,508,983 discloses the use of gamma-amino propyl triethoxysilane to bond copper to a polyester base adhesive in the manufacture of a printed circuit board. This reference emphasizes the point that copper oxide should be removed prior to the silane treatment to affect good bonding.

U.S. Pat. No. 4,499,152 discloses formation of a metal laminate with utility of high resolution printed circuit patterns. The laminate preferably contains a resin-bonded, glass reinforced substrate, a layer of coupling agent covering and bonded to a major surface of the substrate and a layer of ultra-thin copper adjacent the layer of coupling agent, and a composite bonding layer dispersed between the copper layer and the layer of coupling agent. A disclosure class of coupling agents includes organosilanes.

European Patent Application 88115951.1, published as 0310010 on Apr. 5, 1989, discloses a process for forming multilayer printed circuit boards wherein a ureido silane is used to improve adhesion between tin-plated copper circuitry and the cured insulating layer during subsequent soldering operations. While this process is generally effective when the resulting laminates are prebaked before soldering, in some instances when prebaking is not employed delamination can occur during soldering.

SUMMARY OF THE INVENTION

The present invention is directed to a process and article formed thereby in formation of a multilayer printed circuit board containing conductive through-holes which make electrical connections to a series of electrically conducting layers through several insulating and dielectric layers comprising the steps of:

(a) forming electrically conductive copper circuitry on a surface of a dielectric layer support with the circuitry having a thickness of at least 4 microns;

(b) forming on the copper circuitry a layer of an oxide, hydroxide or combination thereof of tin by application of tin to the copper circuitry whereby during application or subsequent thereto the applied tin is converted on its surface to the corresponding oxide, hydroxide or combination thereof with the proviso that the layer of oxide, hydroxide or combination is not greater than 1.5 microns in thickness;

(c) applying a silane bonding mixture to the surface of the oxide, hydroxide or combination thereof formed in step (b) or on an insulating layer to be bonded to the copper circuitry, the insulating layer comprising a partially cured thermosetting polymer composition and the silane bonding mixture consisting essentially of:

(I) a ureido silane having the structure

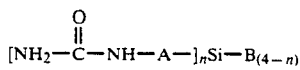

wherein A is an alkylene having 1 to 8 carbon atoms, B is a hydroxy or an alkoxy having 1 to 8 carbon atoms and n is an integer of 1, 2, or 3 with the proviso that if n is 1 or 2 each B need not be identical; and (II) a disylyl crosslinking agent having the structure

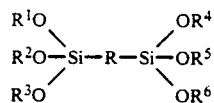

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms;

(d) repeating steps (a), (b) and (c);

(e) bonding materials formed by steps (a), (b), (c) and (d) into a single article whereby an organosilane coating is between a layer of the oxide, hydroxide or combination and an insulating layer whereby during bonding the partially cured insulating layer is cured;

(f) forming a number of holes through the bonded article formed in step (e);

(g) metallizing walls of the through-hole to form electrically conductive paths from opposite openings of the through-hole to form a multilayer circuit board with the proviso that the multilayer printed circuit board will not delaminate upon exposure to thermal stress at 550° F. for 10 seconds after baking at 250° F. for 6 hours and then pre-conditioning at 85° C. and 85% relative humidity for twenty-four (24) hours.

The present invention is also directed to a silane bonding mixture for forming a moisture resistant multilayer circuit board consisting essentially of:

(I) a ureido silane having the structure

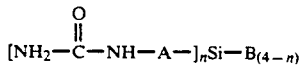

wherein A is an alkylene having 1 to 8 carbon atoms, B is a hydroxy or an alkoxy having 1 to 8 carbon atoms and n is an integer of 1, 2, or 3 with the proviso that if n is 1 or 2 each B need not be identical; and (II) a disylyl crosslinking agent having the structure

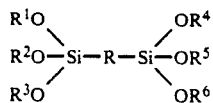

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms.

DETAILED DESCRIPTION OF THE INVENTION

The present invention is directed to a process for forming a multilayer printed circuit board. The circuit board has alternating layers of dielectric material which support copper circuitry (which may have interspaced other layers such as a copper sheet which serves as a conductive ground plane) which are adhered to an insulating layer through intermediate layers. The circuit board has conductive through-holes which form electrical paths across the entire thickness of the board.

In formation of multilayer circuit boards several dozen conductive and nonconductive layers can be employed. Also, for formation of multilayer circuit boards, it is necessary to drill holes and defects can occur due to delamination of layers in the areas immediately surrounding a hole. If a defect is present in one of the layers or if delamination occurs, generally the entire board must be scrapped. Therefore high quality in each of the steps of formation of the printed circuit board is essential for commercial production.

With the techniques of the present invention, various articles can be formed. Illustratively one article can contain in order, a dielectric layer, copper circuitry with layer of tin and an oxide, hydroxide or combination thereof of the underlying tin, organosilane, an insulating layer, a second dielectric layer, copper circuitry with a layer of tin, an oxide, hydroxide or combination thereof of the underlying tin, organosilane and a second insulating layer. In the above article the (first) insulating layer can be contacted to the second dielectric layer directly or through an adhesive layer. (Such adhesives are well known in the art, e.g., a high temperature epoxy.)

In an alternate article the second dielectric layer need not be present with all other layers having the same order. In a further alternate embodiment of the invention a dielectric layer can be present which has copper circuitry on opposite surfaces. Thereafter on the opposite surface the various layers are applied including optionally a layer of tin with an oxide, hydroxide or combination thereof of the underlying tin, organosilane and insulating layer.

For the multilayer circuit board or a portion thereof containing layers bonded together, a conventional test to determine whether an effective bond is formed with or without intermediate layers is a measurement of the bond strength. The force necessary to separate the layers can be measured by an Instron test apparatus. However, in some instances it is found that the bond strength alone is not a sufficiently rigorous test procedure since failure can occur due to the conditions in which a multilayer board is subjected during processing in commercial use. A useful test in accordance with the present procedure is whether delamination will occur at elevated temperature due to thermal stress is described in MIL-P-55110-D. In actual use the outer surface of a multilayer bond is conventionally exposed to molten solder. Although the inner layers may not be exposed to the solder, they are subjected to elevated temperature. Therefore a practical test for broad commercial use to correlate whether the multilayer board can be used for general widespread commercial application is one or more tests set forth in MIL-P-55110-D.

One of the tests in MIL-P-55110-D requires thermal stress at 550° F. for 10 seconds after a pre-conditioning bake at 275°-300° F. for two (2) hours. The specimen, i.e., the article, is visually inspected for cracking or plating, separation or plating and conductors, blistering or delamination. Laminate voids with the largest dimension of 0.003 inch (0.08 mm) or less are permitted provided the conductor spacing is not reduced below the minimum dielectric spacing, laterally or vertically. In a more preferred mode for a more stringent test, a time period of 60 seconds is employed rather than 10 seconds.

In another mode for the test procedure the final multilayer circuit board meets all applicable test procedures of MIL-P-51110D.

One reason why this test is applicable to commercial use is due to the diversity of materials employed in the multilayer construction. Although copper is the metal of choice in formation of conductive circuitry, dielectric and insulating layers (which can be of the same material with dielectric employed in the present context to refer to the initial support for a copper sheet which is formed into circuitry while insulating layer refers to another layer to which the circuitry is bonded through intermediate layers) material can drastically differ. Examples of preferred materials are epoxy and polyimide.

Although the above tests are generally useful in predicting layer bonding in printed circuit manufacture, a more rigid test is needed in the instance when multilayer circuit boards are soldered without a prior baking step to remove moisture. In such instances, delamination at the interface between the circuit and cured insulator layer may occur during soldering, presumably due to residual water or other materials which are volatilized during soldering at the interface. A useful test in accordance with this alternate procedure is a "solder immersion stress test" wherein test multilayer printed circuit test boards are first baked at 250° F. (121° C.) for 6 hours and then conditioned in an environmental test chamber maintained at 85° C. and 85% relative humidity (RH) for 0, 4, 24, 48, and 72 hours, after which they are immersed in solder maintained at 550° F. (288° C.) for 10 seconds. Each multilayer test board contains eight 100% ground planes of copper and except for the specific variation under test, is made under the same conditions. If no subtle or gross delamination effects are observed, the board is considered acceptable and the evaluation of one group of test boards vs. others is made based on the minimum conditioning time needed before failure is observed. The criteria of acceptability which corresponds to printed circuit manufacturing standards requires that there be no delamination after at least 24 hours conditioning time and preferably after 72 hours conditioning.

A starting material in the present invention is a dielectric layer which contains on one or opposite surfaces a cladding of copper. This copper layer is of a thickness of at least 4 microns and more preferably 32 microns and it is used to form conductive circuitry. Well-known techniques in the prior art can be employed to form such circuitry such as by photoimaging technique of a photosensitive resist film followed by etching of unprotected areas of the copper. An example of a suitable technique is disclosed in U.S. Pat. No. 3,469,982. The composition of the dielectric layer is not critical provided it functions as an electrical insulator. Useful support materials are disclosed in U.S. Pat. No. 4,499,152 such as epoxy reinforced with glass fiber. Preferably a partially cured thermosetting polymer composition is employed which is known in the art as a prepreg or "B" stage resin. Use of such polymer composition adds in subsequent bonding operations.

After formation of the conductive circuitry, it typically is necessary to form a thin outer layer of an oxide, hydroxide or combination thereof. This layer which is of a thickness not greater than 1.5 microns and more preferably not greater than 1.0 microns can be directly formed by oxidation of the copper circuitry. Well-known techniques used to form so-called "brown" or "black" oxide coatings can be employed. However major problems have been encountered due to a phenomenon known as pink ring formation whereby the oxide is dissolved or is at least partially destroyed due to later required processing steps. Significant research efforts have been undertaken to solve this pink ring effect. Also in formation of oxide coatings corrosive chemicals have been employed which causes problems due to the use of harsh chemicals with special processing necessary. In instances when multilayer circuit boards are soldered without a prior baking step to remove moisture, delamination at the interface between the circuit and cured insulator layer has been observed during soldering. It is theorized that residual water absorbed by the laminate from the ambient environment is concentrated at the interface and vaporizes during soldering to cause this localized delamination.

In an embodiment of this invention a conductive layer is formed from tin. As will be more fully described below, a preferred technique of application of the coating is by immersion metal plating. The thickness of the metal layer is not critical and can be, e.g., 0.15 to 0.25 microns. During, and subsequent to, the application of tin, a thin coating of an oxide, hydroxide or combination thereof is formed. Since this coating can be extremely thin preferably not greater than 1.5 microns or in some instances only monolayers in thickness, air oxidation can be employed. In such case, the oxide/hydroxide can be formed upon standing at room temperature wherein the copper surface reacts with ambient oxygen and water vapor. Other techniques for formation of the oxide/hydroxide include immersion in or exposure to an oxidative aqueous bath.

An organosilane mixture of this invention is applied as a coating either to the oxide, hydroxide or combination or to a partially cured thermosetting polymer composition, also known in the art as a prepreg or "B" stage resin. The same materials of construction as the dielectric layer can be employed for this layer which is termed an insulating layer to more readily distinguish the layers from one another. Turning to the silane which can be employed in the present invention, it is a requirement that the silane forms an adherent intermediate layer which bonds this oxide, hydroxide or combination thereof to the partially cured and converted to the fully cured insulating layer. It is a requirement that the silane functions to prevent delamination in accordance with the thermal stress test as defined herein. In a preferred mode the multilayer circuit board with fully cured insulating layer meets all specifications of MIL-P-55110D.

Turning to organosilane, it is considered that the ureido silane forms hydrogen bridge bonds with silanole (Si—OH)-groups of the silane and/or form covalent metal —O—Si bonds in a condensation reaction. The silanes are considered to interact with the adjacent layers through a functionally substituted organic group to provide van der Walls force interaction, strong polar force/hydrogen bridge interaction, or covalent bond formation with the dielectric resin. It is considered that the disylyl crosslinking agent forms a network with the ureido silane to reduce the moisture sensitivity of the resulting adherent organosilane layer.

The moisture resistant, adherent, organosilane layers of this invention are prepared from a silane bonding mixture which has as its essential components (I) at least one ureido silane having the structure:

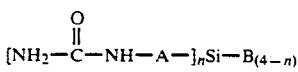

where A is an alkylene having 1 to 8 carbon atoms, B is a hydroxy or an alkoxy having 1 to 8 carbon atoms and n is an integer of 1, 2, or 3 with the proviso that if n is 2 or 3, B need not be identical; and (II) a disylyl crosslinking agent having the structure

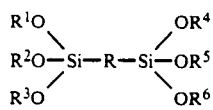

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms.

Preferably in Formula I each B group is identical if more than one B group is present. Also preferably $R^1$, $R^2$, $R^3$, $R^4$, $R^5$ and $R^6$ are identical. In the ureido silane (I), the alkylene group, A, preferably is a divalent ethylene or propylene and the alkoxy group, B, preferably is a methoxy or ethoxy group. A particularly preferred ureido silane is gamma-ureidopropyl-triethoxysilane. In the disylyl crosslinking agent (II), the alkyl group preferably is methyl or ethyl and the alkylene group, R, preferably is a divalent ethylene or propylene group. A particularly preferred disylyl crosslinking agent is hexamethoxydisylylethane.

The component concentrations of the silane bonding mixture may vary widely to meet the needs of a particular application. Thus the weight ratio of the ureido silane (I) to the disylyl crosslinking agent (II) may be between 99:1 and 1:99. Preferably the weight ratio of (I):(II) is between 90:10 and 10:90 and more preferably is between 90:10 and 70:30. Typically a single ureido silane is used with a single disylyl crosslinking agent, however, it is within the scope of this invention to use in the silane bonding mixture, two or more ureido silanes as defined and/or two or more disylyl crosslinking agents as defined.

In the practice of this invention the silane bonding mixtures may be applied as a liquid solution to the tin hydroxide/oxide surface or insulating layer surface. In this instance the silane bonding mixture contains a mutual solvent for the ureido silane and the disylyl crosslinking agent. The solution is applied by any conventional means, e.g., by dipping, spraying, brushing, immersion, etc.

The immersion metal coatings disclosed in European Patent Application 88115951.1 supra, European Patent 216,531 as well as U.S. Pat. No. 4,657,632 are directly useful in the present invention for initial bonding to the copper circuitry. These publications are incorporated by reference herein. However, it is considered that the immersion tin coatings are insufficient to form a direct bond between the electrically conductive layer copper surface and a dielectric material since delamination can occur particularly due to thermal stress. The organosilane has the ability to increase the bond strength. A preferred coating composition contains a thiourea compound, a tin salt, a reducing agent, an acid and a urea compound. In accordance with the teachings of these prior art publications a urea compound is necessary. However a urea compound is not necessary with an organosilane layer. Therefore it is directly within the scope of the present invention that wherever the term urea compound is present in reference to the above publications it can be deleted. Therefore similar formulations can be deleted directly employed as disclosed in these publications except the urea compound can be omitted. In a preferred embodiment the urea will be present.

Since in a preferred embodiment compositions which employ a thiourea compound, a tin salt, a reducing agent, an acid and a urea compound, pertinent disclosure for these publications is reproduced herein.

The tin salt preferably comprises a stannous salt. Although stannous salts of an inorganic (mineral) acid or organic acid may be used (e.g., stannous formate, stannous acetate and the like) the tin salt may comprise a stannous salt of a mineral acid such as the sulfur, phosphorous, and halogen acids, especially the sulfur acids such as sulfuric acid or sulfamic acid. Alkali metal stannates may also be used such as sodium or potassium stannate and the art known equivalents thereof. In one embodiment stannous sulfate, stannous sulfamate or stannous acetate is used as the tin salt. Where tin lead coatings are deposited, lead acetate may be used as the lead salt.

The acids that are employed may be organic acids or inorganic acids (mineral acids) based on sulfur, phosphorous, or the halogens, the sulfur based mineral acids being preferred such as sulfuric acid or sulfamic acid. Some of the organic acids that may be employed comprise monocarboxylic or dicarboxylic acids having up to about six carbon atoms such as formic acid, acetic acid, malic acid, maleic acid, and the like.

It is preferred, if possible not to use halogen acids or halogen salts since halide residues will be produced in the tin coating deposited, these salts interfering with the electrical properties of the tin and may also act as corrosive materials in the coating.

The chelating agents that may be employed generally comprise the various classes of chelating agents and specific compounds disclosed in Kirk-Othmer, *Encyclopedia of Chemical Technology*, Third Edition, Volume 5, pages 339-368 incorporated herein by reference. Chelating agents that are especially preferred comprise the aminocarboxylic acids and the hydroxycarboxylic acids. Some specific aminocarboxylic acids that may be employed in this respect comprise ethylenediaminetetraacetic acid, hydroxyethylethylenediaminetriacetic acid, nitrilotriacetic acid, N-dihydroxyethylglycine, and ethylenebis(hydroxyphenylglycine). Hydroxy carboxylic acids that may be employed comprise tartaric acid, citric acid, gluconic acid and 5-sulfosalicylic acid.

The various reducing agents that may be employed are well known in the art and generally comprise organic aldehyde whether saturated or unsaturated, aliphatic or cyclic, having up to about ten carbon atoms. Lower alkyl aldehydes having up to about six carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde; erythrose; threose; arabinose and the various position isomers thereof and glucose and the various position isomers thereof. Glucose has been found to act to prevent oxidation of the metal salts to a higher oxidation state, e.g., SnII to SnIV, but also as a chelating agent and is especially useful for these reasons.

The surfactants that may be employed comprise any non-ionic, anionic, cationic or amphoteric surfactant such as those listed in Kirk-Othmer, *Encyclopedia of Chemical Technology*, Third Edition, Volume 22, pp. 332-387 which is incorporated herein by reference. The non-ionic surfactants are especially preferred.

The surface area of the tin oxide/hydroxide layer to which the hydrolyzed silane is applied is a factor in the resulting bond strength. Thus high surface areas such as produced by oxidizing a copper surface to copper oxide, then hydrolyzing the oxide and conversion to tin oxide by an immersion process give a high surface area which gave the highest bond strength when bonded to polyimide after the silane treatment.

In accordance with the present invention is a requirement that the bonding of the metal layer which is generally supported by an insulating layer to a dielectric layer can withstand a solder immersion stress test as defined hereinafter relative humidity (RH) preconditioning for at least 14 hours.

After having bonded the various layers of a multilayer construction by applying pressure and heat in a lamination press holes (for electrical interconnect) are drilled through the multilayer, typically using a numerically controlled drilling machine with multiple heads and air bearings. Such drilling operations are described, e.g., in Handbook of Printed Circuit Design, Manufacture, Components and Assembly (Chapter 4.3.2. pg. 254) by G. Leonida, Electrochemical Publications, 1981 and Printed Circuits Handbook (Chapter 5.8–5.12) Edited by Clyde F. Coombs, Jr., McGraw-Hill Book Co., 2nd Edition.

Well known techniques for hole formation and making the hole conductive can be employed herein, e.g., see Printed Circuit Technology, edited by N. S. Einarson, 1977, Chapter 7.

To further define the present invention the following example is provided. In this example all parts and percentages are by weight and degrees are in Centigrade unless otherwise described. In the example, copper clad laminate or copper foil was employed as a sheet rather than processed to form circuitry. The use of a copper sheet was considered to denote more reproductivity in test measurements. Also, in the example, hole drilling was not employed which likewise was considered to allow greater reproductivity to test results.

EXAMPLE 1

The copper surface of the test samples were chemically cleaned, treated with an immersion tin composition and a silane bonding mixture in an inline spray system, and evaluated versus an organosilane coupling agent, gamma-ureidopropyl triethoxysilane, and conventional brown and black oxide.

The test samples were Norplex/OAK FR-4 epoxy laminate panels (18 inches wide, 24 inches long and 0.014 inches thick) containing 1 oz. copper on both sides. Test samples of 0.0014 inch thick copper foil (1 oz. copper) was also processed for bond strength determination.

The inline spray system used to prepare the sample surfaces had a conveyor speed of 4 feet per minute and contained the following process steps and conditions.

| | Conveyor Length | Rinse (Solution) Water Flow | Rinse (Solution) Temp (°F.) | Spray Pressure (PSI) |
|---|---|---|---|---|
| 1. Panel Feed (Input) | 23" | — | — | — |
| 2. Alkaline Cleaner | 20" | — | 120 | 25 |
| 3. Water Rinse | 20" | 5 GPM* | 60 | 20 |
| 4. Microetch | 27" | — | 110 | 25 |
| 5. Water Rinse | 20" | 5 GPM | 60 | 20 |
| 6. Immersion Tin Application | 48" | — | 75 | 25 |
| 7. Water Rinse (Recycle) | 20" | — | 110 | 25 |
| 8. Water Rinse followed by air knife drying | 20" | 5 GPM | 60 | 20 |
| 9. Silane Treatment | 20" | — | 75 | 25 |
| 10. Hot Air Dryer | 30" | — | 130 | — |
| 11. Output Conveyor | 41" | — | — | — |

*GPM is gallons per minute

The alkaline cleaner used in the system was Versaclean® 415 (Du Pont) and the microetch was Sureetch® 550 (Du Pont) potassium peroxy monosulfate/sulfuric acid.

In Step 6 the immersion tin composition was formed by mixing Solution A and Solution B of the following composition:

| | |
|---|---|
| Solution A | |
| D.I. Water | 200 ml |
| Conc. H$_2$SO$_4$ | 100 ml |
| Hypophosphorus acid (50%) | 40 ml |
| Stannous Sulfate | 20 gms |
| D.I. Water | To 0.5 liter |
| Solution B | |
| Thiourea | 60 gms |
| Urea | 40 gms |
| D.I. Water | To 0.5 liter |

Sufficient solution is prepared to adequately fill the system reservoir.

Several test solutions were prepared for use in the silane treatment Step 8.

Solution 1 is prepared by adding 57 ml of glacial acetic acid to 57 liters of deionized water. 570 grams of gamma-ureidopropyltriethoxysilane (A-1160 Union Carbide) coupling agent is then added and mixed by activating the recirculating system of the spray module. The solution is allowed to mix for 15 to 20 minutes to insure complete hydrolysis of the organosilane to an organosilane-triol. This solution is hereinafter identified as 1% A-1160.

Solution 2 is prepared as in Solution 1 but contains 0.15% of 1,2-bis(trimethoxysilyl)ethane in addition to the 1% of A-1160 and will hereinafter be identified as 1% A-1160/0.15% BIS (and as Sample A in Table 1).

Solution 3 is prepared as in Solution 1 but contains 0.20% of 1,2-bis(trimethoxysilyl)ethane in addition to the 1% of A-1160 and will hereinafter be identified as 1% A-1160/0.20% BIS (and as Sample B in Table 1).

To compare the effect of silane treatment to a commercially accepted standard, samples of FR-4 epoxy laminate and copper foil were prepared which were treated with commercial black oxide (MacDermid MAC-u-BLACK* Black Oxide) and brown oxide (Electrochemicals 499 Brown Oxide) hereinafter identified as Black Oxide and Brown Oxide respectively.

After treatment, all laminate and copper foil samples were baked at 250° to 270° F. for 1 hour. This exposure was considered to simulate conditions actual laminates typically would be subjected to prior to preparation of a multilayer board. The higher temperature and time assured removal of moisture which could result in delamination during manufacturing of the multilayer boards.

sample is designated "OK"; if there is subtle delamination or measles, the sample is designated "SLT"; and if there is gross delamination, the sample is designated "FAIL".

Bond or peel strength determinations are made on an Instron Tensile Tester, (Instron Eng. Corp., Quinsey, Mass., U.S.A.) Model TT-B with a crosshead speed of 2 inches/minute. The Instron Unit is in an environmentally controlled area at 70° F., 5° F. and 50%, 10% relative humidity.

TABLE 1

THERMAL STRESS AND BOND STRENGTHS

| | | | Hours at 85° C./85% RH | | | | | Bond Strength lbs./in. |
|---|---|---|---|---|---|---|---|---|
| | | | 0 | 4 | 24 | 48 | 72 | |
| Sample A | 1080 | Prepreg (High Resin) | OK | OK | OK | OK | OK | 8.8 |
| Sample A | 7628 | Prepreg (Low Resin) | OK | OK | OK | FAIL | FAIL | 8.2 |
| Sample B | 1080 | Prepreg | OK | OK | OK | OK | OK | 8.0 |
| Sample B | 7628 | Prepreg | OK | OK | OK | SLT | FAIL | 8.2 |
| 1% A-1160 | 1080 | Prepreg | OK | FAIL | FAIL | FAIL | FAIL | 8.4 |
| 1% A-1160 | 7628 | Prepreg | OK | FAIL | FAIL | FAIL | FAIL | 7.6 |
| Black Oxide | 1080 | Prepreg | OK | OK | OK | FAIL | OK | 3.5 |
| Black Oxide | 7628 | Prepreg | OK | OK | OK | SLT | SLT | 5.0 |
| Brown Oxide | 1080 | Prepreg | OK | OK | OK | FAIL | FAIL | 5.9 |
| Brown Oxide | 7628 | Prepreg | OK | OK | OK | FAIL | FAIL | 7.1 |

Sample A is 1% A-1160/0.15% BIS
Sample B is 1% A-1160/0.20% BIS

Following the bake treated laminates and foils are used with prepreg sheets to prepare 8-layer multilayer composite boards. Two types of Norplex/OAK prepreg were used to prepare two sets of multilayer boards; Type 1080 contains approximately 65.5% resin content with fine weave glass cloth, and Type 7628 contains 45±5% resin content with heavy weave glass cloth. The multilayer composites were prepared as follows. Each composite was assembled from 3 laminates (one inner and two outer), two outer foil sheets and 8 prepreg sheets so that two prepreg sheets are between the treated copper surfaces of each outer laminate and the adjacent copper foil sheet. Ten multilayer assemblies are stacked to form a package with each assembly being separated from the other by a 0.025 inch thick aluminum sheet. The package is enclosed in a vacuum bag which is then evacuated to remove air and sealed. The package is then loaded and centered as rapidly as possible into a hydraulic press preheated to 190° F. The platens are closed and pressure of 25 psi is applied for 12 minutes. Then the pressure is increased to 200 psi and the temperature raised to 365° F. and held for 90 minutes. While maintaining the pressure constant, the package is cooled using chilled 60° F. water for 45 minutes. The pressure is then relaxed and the package removed which is then post baked for 8 hours at 324° F.

A ¼ inch wide strip of each multilayer composite formed during the lamination is removed for bond strength determination and the remainder of the composite panel is processed through an etcher to remove the outer foil layers. The panel is then routed on an Excellion Router/Driller, Model EX-200, into 1⅞ inch by 2⅜ inches samples. The samples are then baked in a circulating hot air oven at 250° F. for 6 hours. After cooling to room temperature the samples are placed in an environmental chamber maintained at 85° C. and 85% relative humidity. Samples are removed at 4, 24, 48 and 72 hours and immersed in a 550° F. molten solder bath for 20 seconds. The samples are then rated for delamination; if there is no apparent delamination the Test data in Table 1 clearly show the dramatic improvement in moisture insensitivity when the bonding mixture of A-1160 (i.e., gamma-uriedopropyltriethoxysilane) and BIS (i.e., 1,2-bis(trimethoxysilyl)ethane). Results are comparable to commercially acceptable black oxide treatment and better than brown oxide while maintaining the high bond strength of the simple silane treatment.

What is claimed is:

1. A process for forming a multilayer printed circuit board containing conductive through-holes which make electrical connections to a series of electrically conducting layers through several insulating layers comprising the steps of:
   (a) forming electrically conductive copper circuitry on a surface of a dielectric layer support with the circuitry having a thickness of at least 4 microns;
   (b) forming on the copper circuitry a layer of an oxide, hydroxide or combination thereof of tin by application of tin to the copper circuitry whereby during application or subsequent thereto the applied tin is converted on its surface to the oxide, hydroxide or combination thereof with the proviso that the layer of oxide, hydroxide or combination is not greater than 1.5 mils in thickness;
   (c) applying a silane bonding mixture to the surface of the oxide, hydroxide or combination thereof formed in step (b) or an insulating layer to be bonded to the copper circuitry to form an adherent organosilane coating thereon, the insulating layer comprising a partially cured thermosetting polymer composition and the silane bonding mixture consisting essentially of:
   (I) a ureido silane having the structure

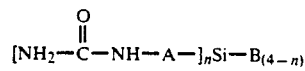

wherein A is an alkylene having 1 to 8 carbon atoms, B is a hydroxy or an alkoxy having 1 to 8 carbon atoms and n is an integer of 1, 2, or 3 with the proviso that if n is 1 or 2, each B need not be identical; and (II) a disylyl crosslinking agent having the structure

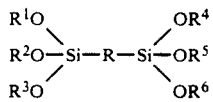

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms;

(d) repeating steps (a), (b) and (c);

(e) bonding materials formed by steps (a), (b), (c) and (d) into a single article whereby an organosilane coating is between a layer of the oxide, hydroxide or combination and an insulating layer whereby during bonding the partially cured insulating layer is cured;

(f) forming a number of holes through the bonded article formed in step (e);

(g) metallizing walls of the through-hole to form electrically conductive paths from opposite openings of the through-hole to form a multilayer circuit board with the proviso that the multilayer printed circuit board will not delaminate upon exposure to thermal stress at 550° F. for 10 seconds after baking at 250° F. for 6 hours and then preconditioning at 85° C. and 85% relative humidity for twenty-four (24) hours.

2. The process of claim 1 wherein steps (a) to (d) include two insulating layers wherein a dielectric layer contacts directly or through an adhesive or insulating layer.

3. The process of claim 1 wherein steps (a) to (d) comprise one insulating layer supporting a layer of copper circuitry.

4. The process of claim 1 wherein the dielectric layer contains copper circuitry on two opposite surfaces.

5. The process of claim 1 in which the tin is applied by an immersion process.

6. The process of claim 1 in which the dielectric layer contains glass epoxy or polyimide.

7. The process of claim 1 in which the circuit board will not delaminate upon exposure at 550° F. for 60 seconds.

8. The process of claim 1 wherein the silane bonding mixture further contains a mutual solvent for the ureido silane and the disylyl crosslinking agent.

9. The process of claim 1 wherein the weight ration of (I):(II) in the silane bonding mixture is between 99:1 and 1:99.

10. The process of claim 9 wherein the weight ratio of (I):(II) is between 90:10 and 10:90.

11. The process of claim 9 wherein the weight ratio of (I):(II) is between 90:10 and 70:30.

12. The process of claim 1 wherein A is a divalent ethylene or propylene group.

13. The process of claim 1 wherein B is a methoxy or ethoxy group.

14. The process of claim 1 wherein the uriedo silane is gamma-ureidopropyl-triethoxy-silane.

15. The process of claim 1 wherein $R^1$, $R^2$, $R^3$, $R^4$, $R^5$ and $R^6$ denote methyl or ethyl.

16. The process of claim 1 wherein R denotes a divalent ethylene or propylene group.

17. The process of claim 1 wherein the disylyl crosslinking agent is hexamethoxydisilylethane.

18. The silane bonding mixture for forming a moisture resistant multilayer circuit board consisting essentially of:

(I) a ureido silane having the structure

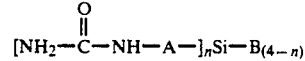

wherein A is an alkylene having 1 to 8 carbon atoms, B is a hydroxy or an alkoxy having 1 to 8 carbon atoms and n is an integer of 1, 2, or 3 with the proviso that if n is 1 or 2, each B need not be identical; and (II) a disylyl crosslinking agent having the structure

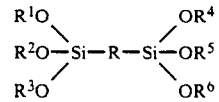

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms.

19. A multilayer printed circuit board containing conductive through-holes which make electrical connections to a series of electrically conducting layers through several insulating layers comprising:

(a) a dielectric layer;

(b) copper circuitry having a thickness of at least 4 microns;

(c) a layer of an oxide, hydroxide or combination thereof of tin metal of a thickness not greater than 1.5 mils which overlies the tin;

(d) an organosilane layer formed from a silane bonding mixture consisting essentially of:

(I) a ureido silane having the structure

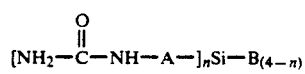

wherein A is an alkylene having 1 to 8 carbon atoms, B is a hydroxy or an alkoxy having 1 to 8 carbon atoms and n is an integer of 1, 2, or 3 with the proviso that if n is 1 or 2, each B need not be identical; and (II) a disylyl crosslinking agent having the structure

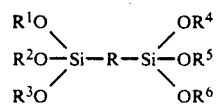

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms;

(e) an insulating layer comprising a cured thermosetting polymer composition;

(f) a dielectric layer;
(g) copper circuitry having a thickness of at least 4 microns;
(h) a layer of an oxide, hydroxide or combination thereof of tin of a thickness not greater than 1.5 mils which overlies the tin;
(i) an organosilane layer formed from the silane bonding mixture;
(j) an insulating layer comprising a cured thermosetting polymer composition; with the proviso that the multilayer printed circuit board will not delaminate upon exposure to thermal stress of solder immersion at 550° F. for 10 seconds after baking at 250° F. for 6 hours and then pre-conditioning at 850° C. and 85% relative humidity for twenty-four hours.

20. A multilayer printed circuit board containing conductive through-holes which make electrical connections to a series of electrically conducting layers through several insulating layers comprising:
(a) a dielectric layer;
(b) copper circuitry having a thickness of at least 4 microns;
(c) a layer of an oxide, hydroxide or combination thereof of tin of a thickness not greater than 1.5 mils which overlies tin;
(d) an organosilane layer formed from a silane bonding mixture consisting essentially of:
(I) a ureido silane having the structure

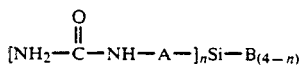

wherein A is an alkylene having 1 to 8 carbon atoms, B is a hydroxy or an alkoxy having 1 to 8 carbon atoms and n is an integer of 1, 2, or 3 with the proviso that if n is 1 or 2, each B need not be identical; and
(II) a disylyl crosslinking agent having the structure

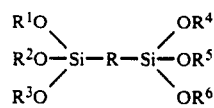

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms;
(e) an insulating layer comprising a cured thermosetting polymer composition;
(f) an organosilane layer formed from the silane bonding mixture;
(g) a layer of an oxide, hydroxide or combination thereof of tin of a thickness not greater than 1.5 mils which overlies the tin;
(h) copper circuitry having a thickness of at least 4 microns;
(i) a dielectric layer; with the proviso that the multilayer printed circuit board will not delaminate upon exposure to thermal stress of solder immersion at 350° F. for 10 seconds after baking at 250° F. for 6 hours and then pre-conditioning at 85° C. and 85% relative humidity for twenty-four (24) hours.

21. A multilayer printed circuit board containing conductive through-holes which make electrical connections to a series of electrically conducting layers through several insulating layers comprising:
(a) a dielectric layer;
(b) copper circuitry having a thickness of at least 4 microns;
(c) a layer of an oxide, hydroxide or combination thereof of tin of a thickness not greater than 1.5 mils which overlies the in;
(d) an organosilane layer formed from a silane bonding mixture consisting essentially of:
(I) a ureido silane having the structure

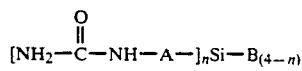

wherein A is an alkylene having 1 to 8 carbon atoms, B is a hydroxy or an alkoxy having 1 to 8 carbon atoms and n is an integer of 1, 2, or 3 with the proviso that if n is 1 or 2, each B need not be identical; and
(II) a disylyl crosslinking agent having the structure

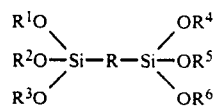

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms;
(e) an insulating layer comprising a cured thermosetting polymer composition;
(f) copper circuitry having a thickness of at least 4 microns;
(g) a layer of an oxide, hydroxide or combination thereof of tin of a thickness not greater than 1.5 mils which overlies the tin;
(h) an organosilane layer formed from the silane bonding mixture;
(i) an insulating layer comprising a cured thermosetting polymer composition; with the proviso that the multilayer printed circuit board will not delaminate upon exposure to thermal stress of solder immersion at 550° F. for 10 seconds after baking at 250° F. for 6 hours and then pre-conditioning at 85° C. and 85% relative humidity for twenty-four (24) hours.

* * * * *